United States Patent
Imura

(10) Patent No.: US 6,658,069 B1
(45) Date of Patent: Dec. 2, 2003

(54) AUTOMATIC GAIN CONTROL CIRCUIT AND CONTROL METHOD THEREFOR

(75) Inventor: Minoru Imura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/337,264

(22) Filed: Jun. 22, 1999

(30) Foreign Application Priority Data

Jun. 24, 1998 (JP) .......................................... 10-176484

(51) Int. Cl.[7] .......................... H04L 27/08; H04B 7/212
(52) U.S. Cl. ...................................... 375/345; 370/332
(58) Field of Search .................................. 375/345, 324, 375/328, 200; 348/655

(56) References Cited

U.S. PATENT DOCUMENTS

| | | | | |
|---|---|---|---|---|
| 4,635,103 A | * | 1/1987 | Steckler et al. | 348/505 |
| 5,233,634 A | * | 8/1993 | Vaisanen | 375/320 |
| 5,276,685 A | * | 1/1994 | Kepler et al. | 370/332 |
| 5,438,683 A | * | 8/1995 | Durtler et al. | 455/74 |
| 5,509,030 A | * | 4/1996 | Mortensen | 375/232 |
| 5,914,986 A | * | 6/1999 | Ohta et al. | 375/328 |
| 6,035,008 A | * | 3/2000 | Kim | 375/345 |

FOREIGN PATENT DOCUMENTS

| | | | |
|---|---|---|---|
| JP | 62-230168 | * | 10/1987 |
| JP | 64-10746 | | 1/1989 |
| JP | 3-235541 | | 10/1991 |
| JP | 4-29431 | | 1/1992 |
| JP | 5-122192 | | 5/1993 |
| JP | 6-85673 | | 3/1994 |
| JP | 7-226725 | | 8/1995 |
| JP | 8-8782 | | 1/1996 |
| JP | 8-320856 | | 12/1996 |
| JP | 8-331192 | | 12/1996 |

* cited by examiner

Primary Examiner—Stephen Chin
Assistant Examiner—Lawrence Williams
(74) Attorney, Agent, or Firm—Sughrue Mion, PLLC

(57) ABSTRACT

An AGC circuit is capable of prevention of occurrence of distortion of an input signal of an A/D converter and enables use of full scale of the A/D converter even in demodulation of a signal of a modulation system, in which a frequency axis is commonly occupied by a plurality of receivers, such as CDMA. The AGC circuit includes an amplifier to amplify an input signal and a controller to compare an amplitude of the input signal and a first reference value and control a gain of the amplifier depending upon a result of the comparison. The AGC circuit further includes first reference value controller to detect a maximum value of the amplitude of the input signal amplified by the amplifier and controlling the first reference value depending upon the maximum value.

16 Claims, 10 Drawing Sheets

AUTOMATIC GAIN CONTROL CIRCUIT AND CONTROL METHOD THEREFOR

BACKGROUND OF THE INVENTION

1. Field of the Invention

The present invention relates generally to an automatic gain control (AGC) circuit and control method therefor. More particularly, the invention relates to an AGC circuit and control method therefor amplifying a received multiplexed signal of a Code Division Multiple Access (CDMA) system or so forth.

2. Description of the Related Art

The conventional AGC circuit is designed to increase a gain of an amplifier circuit when an input voltage is lower than a reference voltage and to decrease the gain when the input voltage is higher than the reference voltage for the purpose of obtaining an output of a constant level and less distortion. Accordingly, the reference voltage is fixed at a predetermined value.

In case of a Time Division Multiple Access (TDMA) system and a Frequency Division Multiple Access (FDMA) system, not so significant problem may be encountered even in the system, in which the reference voltage is fixed.

The reason is that, TDMA and FDMA systems are systems, which permit one receiver to occupy a frequency axis in time sequence. In these system, a relationship between an average value of a reception voltage and a maximum value thereof can be checked in advance by a parameter (such as in a roll off ratio in a Quadrature Phase Shift Keying (QPSK)) of a modulation system.

With the reference voltage thus determined, a signal having substantially constant level and less distortion can be obtained as the output of the AGC circuit. Accordingly, full scale of an analog-to-digital converter (A/D converter) provided on an output side of the AGC circuit can be used effectively.

Next, CDMA system will be discussed briefly. FIG. 11 is a frequency spectrum chart showing a structure of a transmission signal in CDMA system. In FIG. 11, a vertical axis represents an output level (dB) and a horizontal axis represents a frequency (Hz).

In FIG. 11, CDMA system is a system, in which signals from a plurality of stations, e.g. 3 stations of U1 to U3, are transmitted in multiplexed fashion in the same frequency band f. Namely, the signals of a plurality of stations are transmitted in multiplexed fashion at the same time and at the same frequency.

In such modulation system according to CDMA, in which a plurality of receivers commonly occupy the frequency axis, a relationship between the average value and the maximum value of the reception voltage is variable depending upon number of receivers at instantaneous timing to frequently cause difficulty in prevention of occurrence of distortion of the input signal of the A/D converter.

When a number of the receivers receiving the signals at the same timing is large, peak factor (crest factor) of the reception waveform is obviously increased. On the other hand, in order to prevent increasing of the peak factor, a reception S/N can be degraded by setting the reference voltage sufficiently low with respect to the full scale of the A/D converter.

On the other hand, one example of the AGC circuit variable of the reference voltage has been disclosed in Japanese Unexamined Patent Publication No. Heisei 7-226725 which will be hereinafter referred to as first prior art. The disclosed first prior art has been worked out with giving importance for amplification of a small input voltage.

FIG. 12 is a block diagram showing a construction of the conventional AGC circuit disclosed in the first prior art. Referring to FIG. 12, the AGC circuit converts a received orthogonal frequency division multiplexed signal S50 into a baseband by a frequency converting portion 101 and amplifies a baseband signal S51 after conversion by an AGC amplifier 102, and transmits the baseband signal S52 amplified by the AGC amplifier 102 to mixers 106 and 107 by dividing into two paths by a divider 103.

The mixers 106 and 107 mix the respectively input baseband signals S53 and S54 with signals S55 and S56 output from a phase converter 105 and having phase difference of 900 and output signals as first and second baseband signals S57 and S58.

The first baseband signal S57 is converted into a digital signal S59 by an A/D converter 110 via a low-pass filter 108. Similarly, the second baseband signal S58 is converted into a digital signal S60 by an A/D converter 111 via a low-pass filter 109.

Outputs S59 and S60 of the A/D converters 110 and 111 are detected voltages by a rectifier circuit 114, and a voltage S62 depending upon a detected value S61 is generated by a control voltage generator 116.

On the other hand, a voltage generator 120 generates a constant voltage S63. A voltage adder 118 adds the constant voltage S63 to a voltage S62 generated by the control voltage generator 116 to control a gain of the AGC amplifier 102 by a resultant voltage S64.

The voltage S63 to be added is a voltage for controlling the gain of the AGC amplifier 102 so that input waveform to the A/D converters 110 and 111 exceeds allowable inputs of the A/D converters 110 and 111.

When input waveform to the A/D converters 110 and 111 exceeds allowable inputs of the A/D converters 110 and 111, the quantization error for the small amplitude portion of the input waveform to the A/D converters 110 and 111 would be reduced.

The large amplitude portion of the input waveforms to the A/D converters 110 and 111 are clipped exceeding an allowable voltage range to cause influence of distortion or so forth. What is demodulated by a demodulation device is an Orthogonal Frequency Division Multiplexing (OFDM) wave. Considering OFDM wave, occurrence probability of the large amplitude portion is quite small not to cause significant problem in comparison with improvement effect.

FIG. 13 is a frequency spectrum chart of OFDM wave. As shown in FIG. 13, OFDM wave causes mutual interference of a signal at a center frequency f1 and a signal at a center frequency f2 within a frequency region f12, for example, and causes mutual interference of a signal at a center frequency f2 and a signal at a center frequency f3 within a frequency region f23.

However, mutually interfering signals are only two signals and is completely different from the case of CDMA. In the present invention generally handles CDMA mutually interfering three or more signals.

Namely, when the AGC circuit as disclosed in the first prior art is employed in CDMA, the large amplitude portion is clipped exceeding the allowable voltage range of the A/D converter to encounter a problem to cause large distortion or so forth.

Other example of this kind of AGC circuit has been disclosed in Japanese Unexamined Patent Publication No.

Heisei 8-331192 (hereinafter referred to as second prior art). The disclosed invention is directed to a Quadrature Amplitude Modulation (QAM) demodulation device which demodulates a modulated wave signal by performing phase correction based on accurate synchronization detection by simple construction and simple calculation.

The disclosed AGC circuit performs gain adjustment by extracting upper M in number of values of the amplitude values of symbol signals. However, an object of the invention disclosed in the second prior art is to demodulate the modulated wave signal by performing phase correction on the basis of accurate synchronization detection, which is far different from an object of the present invention.

Accordingly, even in the second prior art, there has not been disclosed means for preventing occurrence of distortion in the input signal to the A/D converter in a CDMA demodulation device, as a task of the present invention.

SUMMARY OF THE INVENTION

Therefore, an object of the present invention is to provide an AGC circuit and control method therefor which can prevent occurrence of distortion of an input signal of an A/D converter and whereby to enable use of full scale of the A/D converter even upon demodulation of signals of modulation system, in which a frequency axis is occupied by a plurality of receivers, such as CDMA.

According to the first aspect of the present invention, an AGC circuit comprises:

amplifying means for amplifying an input signal;

control means comparing an amplitude of the input signal and a first reference value and controlling a gain of the amplifying means depending upon a result of comparison; and first reference value control means for detecting a maximum value of the amplitude of the input signal amplified by the amplifying means and controlling the first reference value depending upon the maximum value.

According to the second aspect of the present invention, a control method of an AGC circuit comprises:

a first process of amplifying an input signal, comparing an amplitude of the amplified input signal with a first reference value and controlling an amplitude of the input signal depending upon the result of comparison; and a second process of detecting a maximum value of an amplitude of the amplified input signal with a predetermined period and controlling the first reference value depending upon the maximum value.

With the present invention set forth above, the first reference value, to be compared with the input signal is varied depending upon the maximum value of the amplitude of the input signal to control the gain of the amplifying means.

By the construction set forth above, the AGC circuit is capable of prevention of occurrence of distortion of an input signal of an A/D converter and enables use of full scale of the A/D converter even in demodulation of a signal of a modulation system, in which a frequency axis is commonly occupied by a plurality of receivers, such as CDMA.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 10:
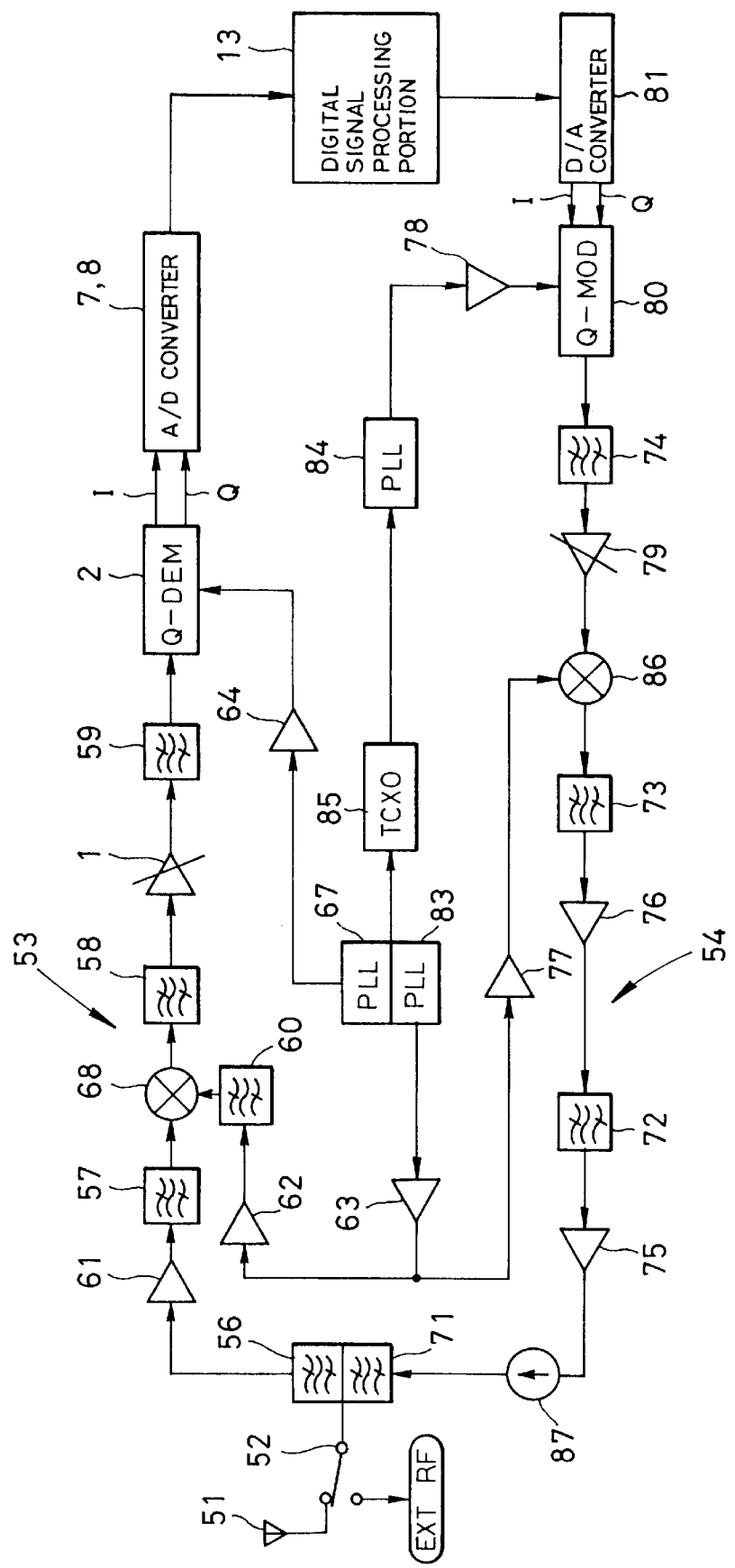
FIG. 10 is an illustration showing an overall construction of a transmission and reception equipment including the AGC circuit according to the present invention.
Figure 11:
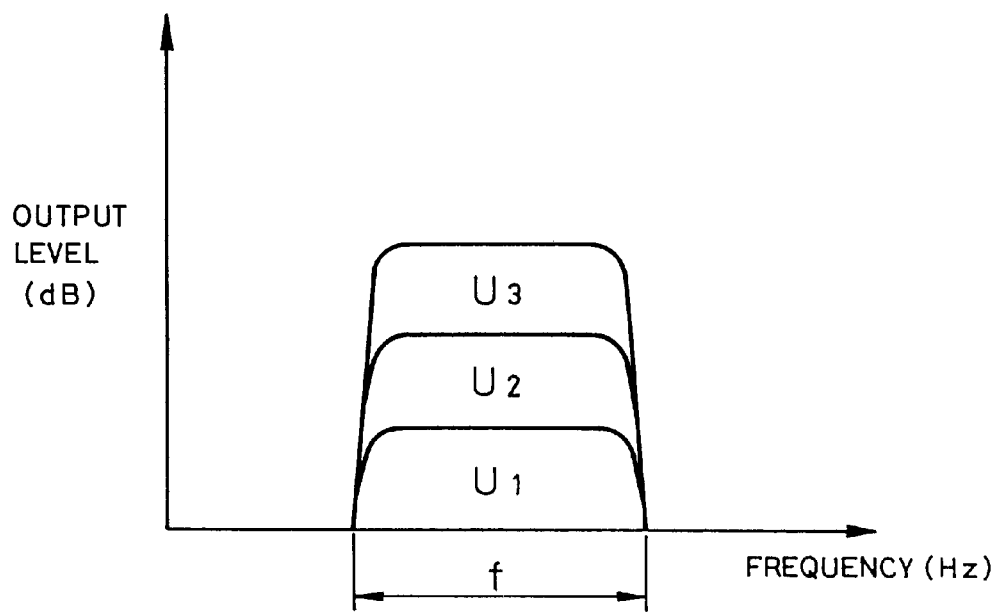
FIG. 11 is a frequency spectrum chart showing a structure of a transmission signal of CDMA system.
Figure 12:
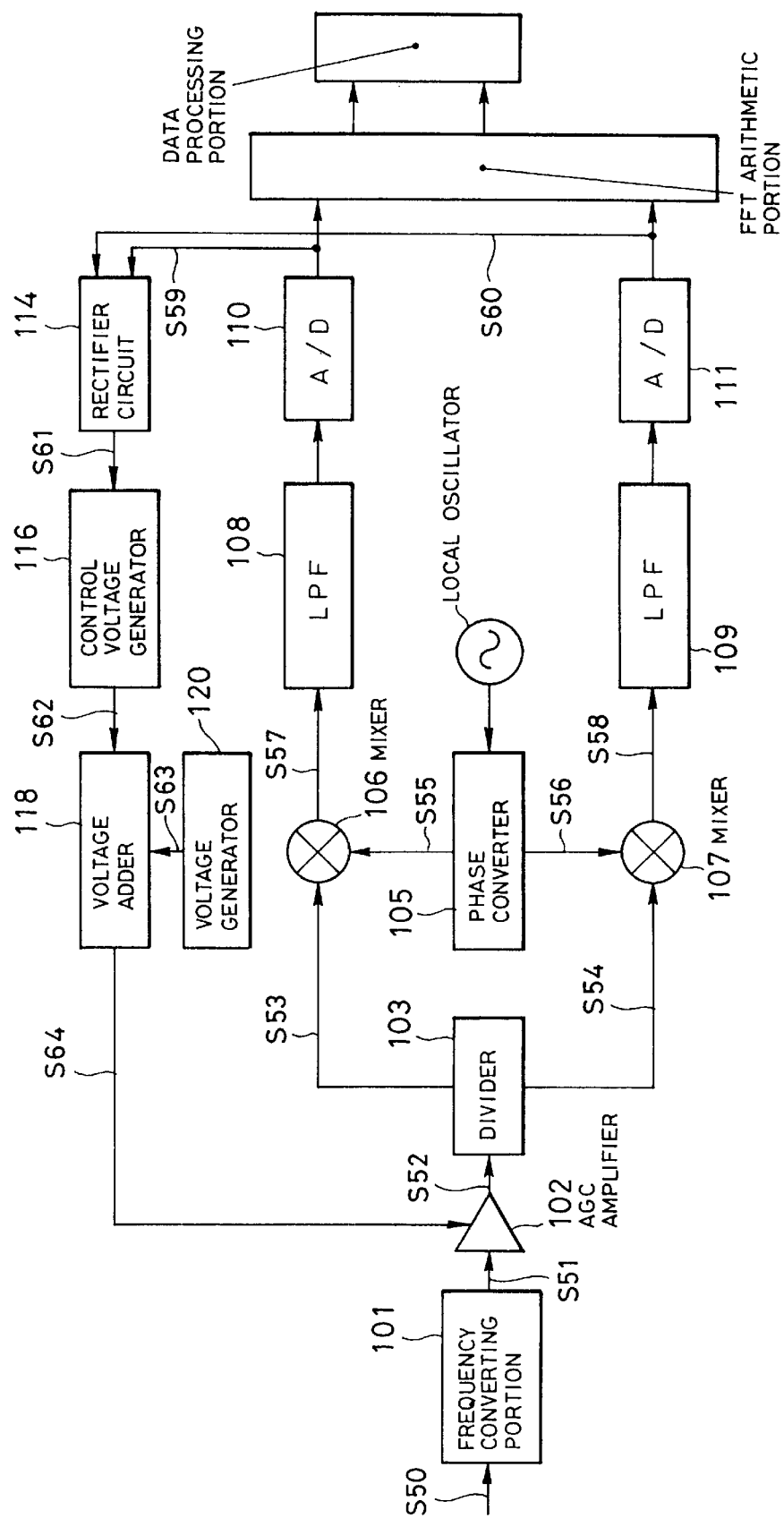
FIG. 12 is an illustration showing a construction of the AGC circuit disclosed in Japanese Unexamined Patent Publication No. Heisei 7-226725.
Figure 13:
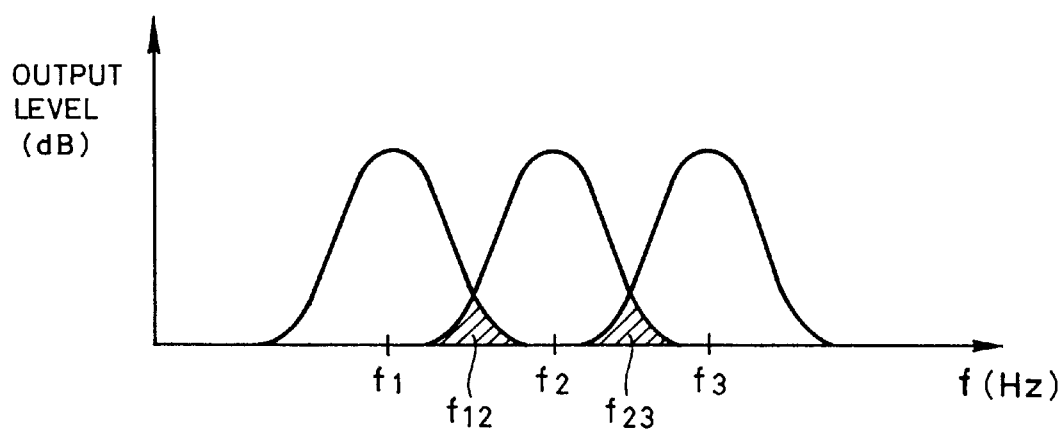
FIG. 13 is a frequency spectrum chart of OFDM wave.

At first, discussion will be given for an overall construction of a mobile station in a mobile radio communication system according to the present invention, and preferably, to a transmission and reception equipment including an AGC circuit. FIG. 10 is an illustration showing the overall construction of the transmission and reception equipment including the AGC circuit according to the present invention. The transmission and reception equipment is constituted with an antenna 51, a changeover switch 52, a receiving portion 53, a transmitting portion 54 and a digital signal processing portion 13.

Furthermore, the receiving portion 53 is constructed with band-pass filters 56 to 60, amplifiers 61 to 64, an AGC amplifier 1, a Quadrature demodulator (Q-DEM) 2, A/D converters 7 and 8 and a Phase Locked Loop (PLL) 67 including a Voltage Controlled Oscillator (VCO) and a mixer 68. The transmitting portion 54 is constructed with band-pass filters 71 to 74, amplifiers 75 to 78, an AGC amplifier 79, a quadrature modulator (Q-MOD) 80, a digital-to-analog (D/A) converter 81, a Phase Locked Loop (PLL) 83, 84 including respective Voltage Controlled Oscillators (VCOs), a Temperature Compensated Xtal Oscillator (TCXO) 85, a mixer 86 and an isolator 87.

Next, discussion will be given for operation. The changeover switch 52 is a switch for switching between an antenna and an external RF (ext RF) terminal. The external RF terminal is used for measurement and vehicle mounting for the purpose of production and maintenance.

At first, discussion will be given for operation of the receiving portion 53. The CDMA signal received by the antenna is processed for frequency conversion by the mixer 68 via the changeover switch 52, the band-pass filter 56, the amplifier 61 and the band-pass filter 57.

The signal from the VCO in the PLL 83 is input to the mixer 68 via the amplifiers 63 and 62 and the band-pass filter 60 as a local signal.

The CDMA signal frequency converted by the mixer 68 is input to the AGC amplifier 1 via the band-pass filter 58. The CDMA signal is amplified by the AGC amplifier 1 and thereafter is demodulated into I (in-phase) component and Q (quadrature) component having phase shifted for 90° relative to the I component by the quadrature demodulator 2. Respective components are converted into digital values through the A/D converters 7 and 8.

On the other hand, the signal from the VCO in the PLL 67 is input to the quadrature demodulator 2 via the amplifier 64.

Then, the I component and the Q component converted into the digital values by the A/D converters 7 and 8 subject to a predetermined digital signal process by the digital signal processing portion 13.

The digital signal processing includes a process for despreading or reverse-spreading by a despreader (not shown) to extract only desired signal.

It should be noted that the AGC amplifier discussed later is constructed by a portion including the AGC amplifier 1, the band-pass filter 59, the quadrature demodulator 2, the A/D converters 7 and 8 and the digital signal processing portion 13, among the foregoing construction.

Next, the operation of the transmitting portion 54 will be discussed. The operation of the transmitting portion 54 is the same operation as the receiving portion 53 effected in reversed sequential order.

At first, the signal is generated by a spreading process by a spreader (not shown) in the digital signal processing portion 13. Thereafter, the spread signal is converted into an analog signal of the I component and the Q component by a D/A converter 81.

The analog converted I component and Q components are processed for quadrature modulation by the quadrature modulator 80 and then input to the AGC amplifier 79 via the band-pass filter 74 for amplification.

The quadrature modulation signal amplified by the AGC amplifier 79 is converted into a predetermined frequency by the mixer 86, and thereafter transmitted from the antenna 51 via the band-pass filter 73, the amplifier 76, the band-pass filter 72, the amplifier 75, the isolator 87, the band-pass filter 71 and the changeover switch 52.

On the other hand, the signal from the VCO in the PLL 83 is input to the mixer 86 via the amplifiers 63 and 77 and the signals from the PLLs 67 and 83 are input to the quadrature modulator 80 via the TCXO 85, the PLL 84 including the VCO and the amplifier 78.

Figure 1:
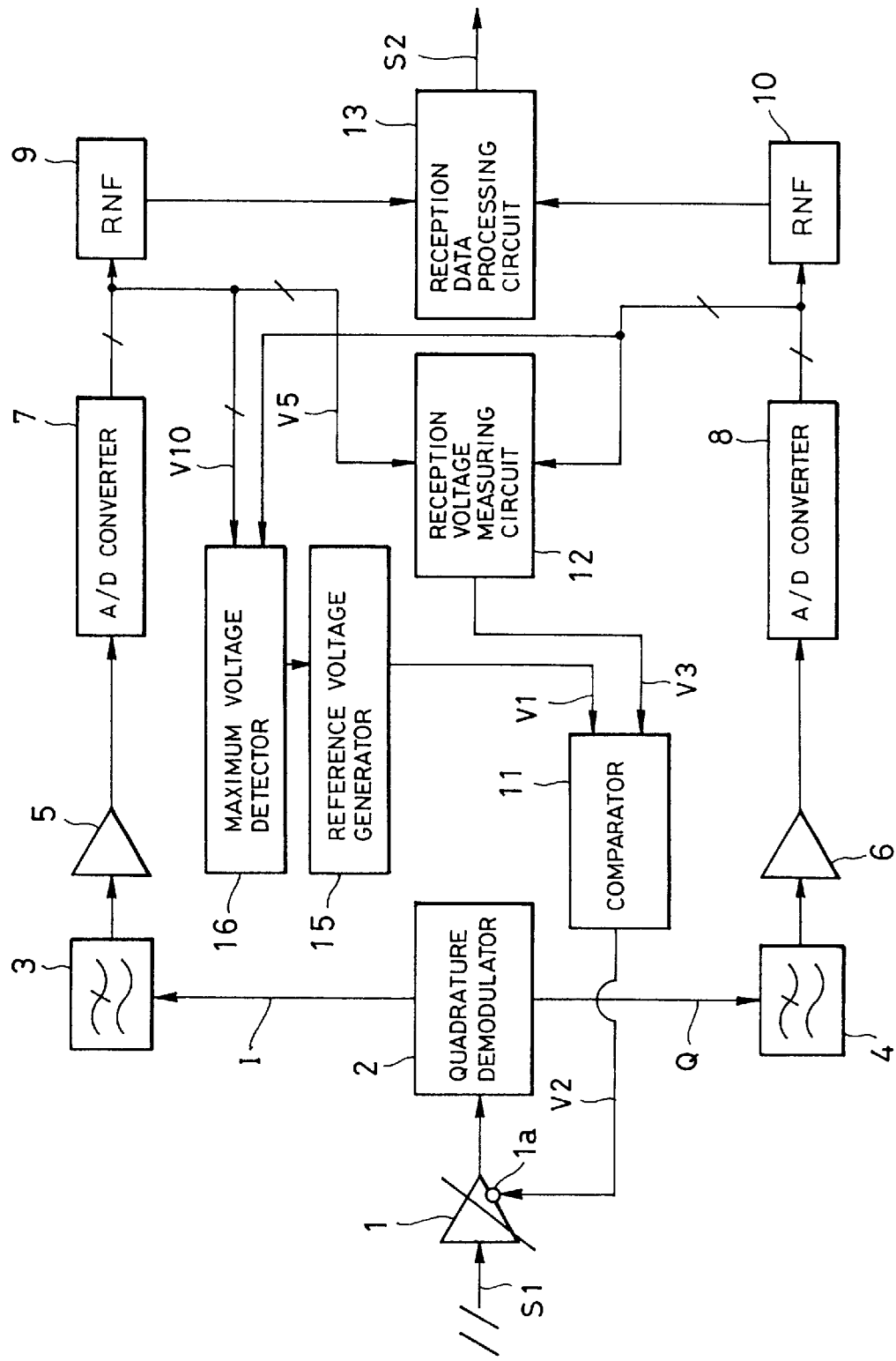
FIG. 1 is an illustration showing a construction of the first embodiment of an AGC circuit according to the present invention.

Next, the first embodiment of the AGC amplifier according to the present invention will be discussed. FIG. 1 is an illustration showing a construction of the first embodiment. It should be noted that similar or common components to those shown in the overall construction shown in FIG. 10 will be identified by like reference numerals and detailed description for such components will be omitted to avoid redundant disclosure and to keep the disclosure simple enough so as to facilitate clear understanding of the present invention.

Referring to FIG. 1, the first embodiment of the AGC amplifier according to the present invention is constructed with the AGC amplifier 1, to which a reception wave is input, the quadrature demodulator 2 demodulating the output signal of the AGC amplifier 1, low-pass filters 3 and 4 extracting a low frequency component of the output signal of the quadrature demodulator 2, the amplifiers 5 and 6 amplifying the output signals of the low-pass filters 3 and 4, the A/D converters 7 and 8 performing analog-to-digital conversion for the output signal of the amplifiers and 5 and 6, route Nyquist filters (RNFs) 9 and 10, performing wave shaping of the output data of the A/D converters 7 and 8, a reception data processing circuit 13 processing the output data from the route Nyquist filters 9 and 10 to take out a desired demodulated output signal, a reception voltage measuring circuit 12 measuring output voltages of the A/D converters 7 and 8 and outputting an average value within a predetermine period, converging as an AGC amplifier loop, a comparator 11 compares an output of the reception voltage measuring circuit 12 and an output of the reference voltage generator 15 for outputting a difference of both outputs, and a maximum voltage detector 16 controlling a reference voltage generated by the reference voltage generator 15.

Next, operation will be discussed. A reception wave S1 is input to the AGC amplifier 1 and is amplified with a gain corresponding to a gain control voltage V2 output from the comparator 11.

The AGC amplifier 1 has a variable gain amplification control terminal 1a to linearly vary amplification by a gain controlling voltage V2 input via the variable gain amplification control terminal 1a.

The quadrature demodulator 2 takes out in-phase I component and quadrature Q component of the baseband signal from the reception wave S1. Respective components I and Q pass respective low-pass filters 3 and 4, amplified by the amplifiers 5 and 6, A/D converted by the A/D converters 7 and 8, wave shaped by the digital filters (route Nyquist filters in the shown embodiment) 9 and 10 so as not to cause intersymbol interference, and output as the demodulated output signal S2 by the reception data processing circuit 13.

It should be noted that the band-pass filter 59 between the AGC amplifier 1 and the quadrature demodulator 2 is neglected in FIG. 1. Also, the reception data processing circuit 13 in FIG. 1 is identified by the same reference numeral with the digital signal processing portion of FIG. 10 which means that the reception data processing circuit 13 of FIG. 1 is included in the digital signal processing portion 13 of FIG. 10.

Returning to FIG. 1, the output voltages V5 and V6 output from the A/D converters 7 and 8 are measured by the reception voltage measuring circuit 12.

Then, an average voltage V3 of the output voltage data V5 and V6 in a predetermined period is measured.

The average value V3 and the reference voltage V1 output from the reference voltage generator 15 are input to the comparator 11 for comparison.

The comparator 11 generates the gain controlling voltage V2 corresponding to a comparison differential voltage to input the gain controlling voltage V2 to the AGC amplifier 1 to control own gain so that the difference between the reference voltage V1 and the average value V3 becomes "0".

The AGC amplifier 1 controls the AGC loop to maintain the input level of the A/D converters 7 and 8 constant and without causing distortion.

The AGC loop is a loop returning to the AGC amplifier 1 again via the quadrature demodulator 2, the A/D converters 7 and 8, the reception voltage measuring circuit 12 and the comparator 11.

Next, discussion will be given for the maximum voltage detector 16. The maximum voltage detector 16 is connected between the outputs of the A/D converters 7 and 8 and an input of the reference voltage generator 15.

The maximum voltage detector 16 detects a maximum voltage V10 of the outputs of the A/D converters 7 and 8 to control the reference voltage V1 generated by the reference voltage generator 15 depending upon how large and/or small the maximum voltage V10 is.

In case of the signal other than the CDMA system, the reference voltage V1 can be derived from the average voltage and the maximum voltage of the outputs V5 and V6 of the A/D converters 7 and 8 relatively easily.

However, in case of the signal of the CDMA system, the maximum voltage is increased and decreased depending upon number of signals to be multiplexed, and is varied as time goes.

Accordingly, if the reference voltage V1 is set similarly to the signal other than the CDMA system, for example, when the signal having instantaneous high voltage is input to the A/D converters 7 and 8, the reference voltage V1 exceeds the full scale of the A/D converters 7 and 8 making it impossible to convert such high voltage into the digital value.

Then, it is assumed that the reference voltage V1 is preliminarily set relatively low expecting input of a high voltage signal to the A/D converters 7 and 8 to lower the gain of the AGC amplifier 1. Then, even when the high voltage signal is input to the A/D converters 7 and 8, such voltage can be converted into the digital signal by the A/D converters 7 and 8.

However, when the high voltage signal is not input to the A/D converters 7 and 8, all of the voltages as converted output of the A/D converters 7 and 8 inherently have low voltage. Assuming that the A/D converters 7 and 8 have performance to output data at 8 bits, only lower several bits are effectively used when all of the converted outputs are low voltage to make it impossible to effectively use the full scale of the A/D converters 7 and 8.

Therefore, by detecting the maximum values of the voltages input to the A/D converters 7 and 8 (equal to the voltages output from the A/D converters 7 and 8), if the maximum value does not reach the full-scale voltage of the A/D converters 7 and 8, the reference voltage V1 is raised to increase the gain of the AGC amplifier 1.

On the other hand, when the occurrence that the maximum value becomes full scale of the A/D converters 7 and 8, exceeds the predetermined reference value, the reference voltage V1 is lowered to decrease the gain of the AGC amplifier 1.

By this, full scale of the A/D converters 7 and 8 can be used effectively.

Figure 2:
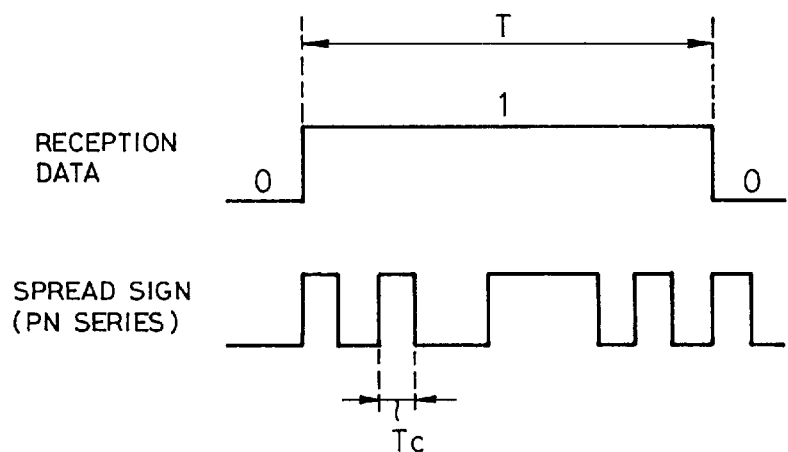
FIG. 2 is a waveform chart showing a relationship between a reception data and a diffusion sign.

Next, detailed operation of respective parts will be discussed. At first, a relationship between the reception data and spread sign will be discussed briefly. FIG. 2 is a waveform chart showing a relationship between the reception data and the spread sign.

As shown in FIG. 2, the spread sign in a chip zone Tc and the reception data in one bit zone width T are multiplied by a not shown multiplier to generate a transmission signal. A signal, on which a plurality of transmission signals are multiplexed, is input to the A/D converters 7 and 8.

On the other hand, in the A/D converters 7 and 8, per chip zone Tc, the reception data per Tc*N (N is greater than or equal to 2) is preferably sampled.

Figure 3:
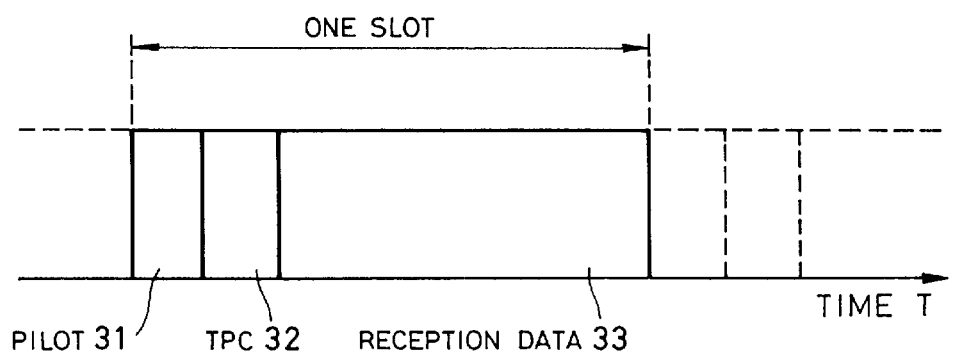
FIG. 3 is an illustration showing one example of a structure of the reception data.

FIG. 3 is an illustration showing one example of a structure of the reception data. As shown in FIG. 3, for example, one slot is formed with a pilot signal 31, a transmitter power control (TPC) 32 and a reception data 33. The reception data 33 is sampled by the A/D converter 7 and 8 and is converted into the digital data V5 and V6.

The digital data V5 and V6 output from the A/D converters 7 and 8 are input to the reception voltage measuring circuit 12. Next, reception voltage measuring circuit 12 will be discussed.

To the reception voltage measuring circuit 12, the digital data V5 of the I component and the digital data V6 of the Q components are input.

Figure 4:
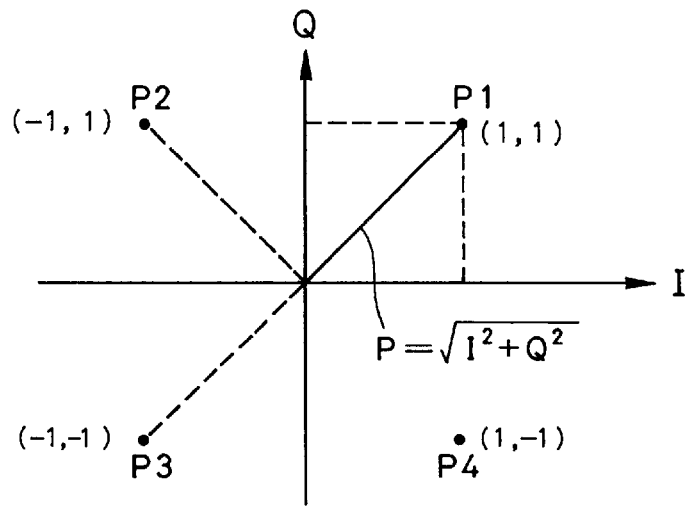
FIG. 4 is a diagrammatic explanatory illustration showing an I component and a Q component by an orthogonal coordinates.

FIG. 4 is a diagrammatic explanatory illustration showing the I component and the Q component in a form of quadrature coordinates. FIG. 4 shows the case where the reception signal is a quadrature phase shift keying (QPSK).

Referring to FIG. 4, a value derived by composing the I component and the Q components is an amplitude value P of the reception signal.

Namely, the amplitude value of the reception signal is expressed by $(I^2+Q^2)^{1/2}$. Accordingly, expressing the reception signal by (I component, Q component), the amplitude value P1 of (1, 1) is $2^{1/2}$. Similarly, when amplitude values P2 to P4 of (−1, 1), (−1, −1) and (1, −1) become $2^{1/2}$.

On the other hand, to the reception voltage measuring circuit 12, signals arrive from a plurality of stations at the same timing. Accordingly, for example, when signals of P1 to P3 arrive simultaneously, a total Pt of the amplitude value becomes $3\times2^{1/2}$. The value Pt is variable depending upon number of arriving signals.

Figure 5:
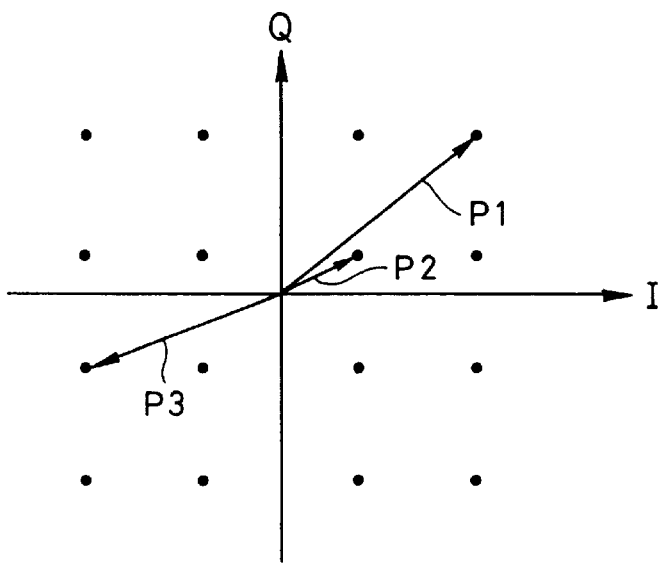
FIG. 5 is a diagrammatic explanatory illustration showing an I component and a Q component by an orthogonal coordinates in the case where a signal is 16 QAM.

FIG. 5 shows the case where the signal is 16-positions Quadrature Amplitude Modulation (16QAM). In this case, the amplitude values P1 and P3 takes the same values but the amplitude value P2 takes smaller value than the amplitude values P1 and P3.

The reception voltage measuring circuit 12 derives the average value V3 of the amplitude value Pt per a given period. The given period is per N slots (N is positive integer), for example.

Next, discussion will be given for the maximum voltage detector 16. The maximum voltage detector 16 detects the maximum value V10 of the amplitude value Pt per N slots.

Figure 6:
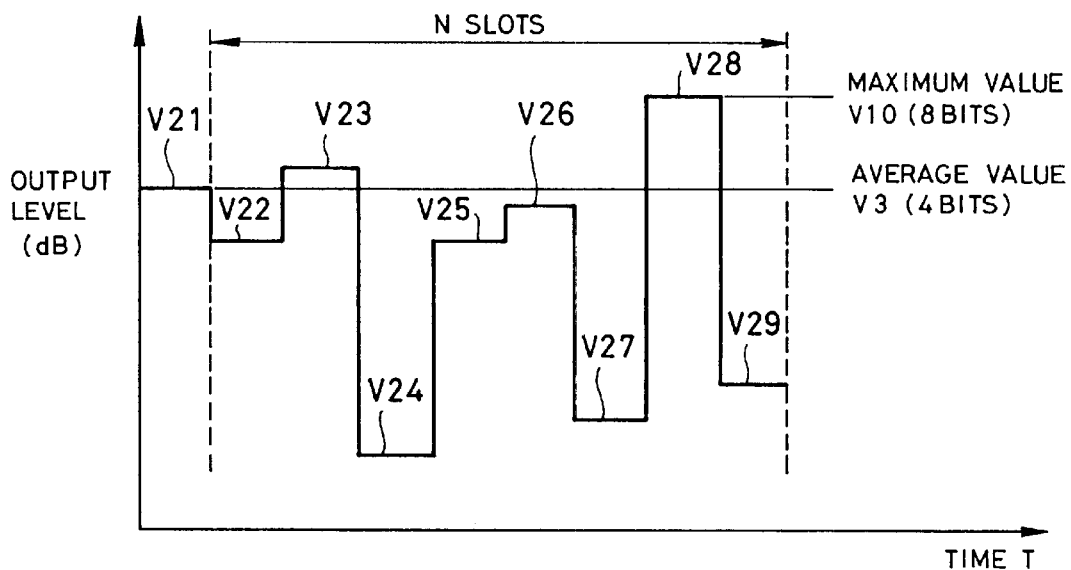
FIG. 6 is a waveform chart showing a relationship between an amplified value Pt and a maximum value V10.

FIG. 6 is a waveform chart showing a relationship between the amplitude value Pt and the maximum value V10.

FIG. 6 shows variation of the levels of the signal (amplitude value Pt) input to the reception voltage measuring circuit 12 and the maximum voltage detector 16 to V21 to V29 according to elapsing of time T.

The maximum value V10 is expressed by the 8 bit outputs from the A/D converters 7 and 8, and the average value V3 (V21) is expressed by the lower 4 bits.

Figure 7:
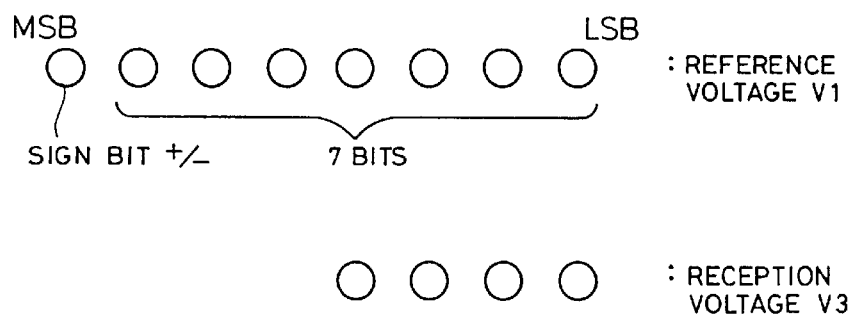
FIG. 7 is a diagrammatic explanatory illustration showing structures of a reception voltage V3 and a reference voltage V1 input to a comparator 11.

Next, discussion will be given with respect to the comparator 11. FIG. 7 is a diagrammatic explanatory illustration showing structures of the reception voltage V3 and the reference voltage V1 input to the comparator 11.

Referring to FIG. 7, the lower 4 bit reception voltage (average value) V3 and 8 bit reference voltage V1 are input to the comparator 11. On the other hand, the reference voltage V1 is input from the reference voltage generator 15 and the reception voltage V3 is input from the reception voltage measuring circuit 12, set forth above.

Among 8 bit of the reference voltage V1, the leading one bit is a sign bit (expressing sign of + or −), and remaining 7 bits express reception voltage. On the other hand, the reception voltage V3 is set at a voltage which can be expressed by lower 4 bits.

The comparator 11 controls gain of the AGC amplifier 1 to make the reception voltage V3 and the reference voltage V1 consistent with each other.

Figure 8:
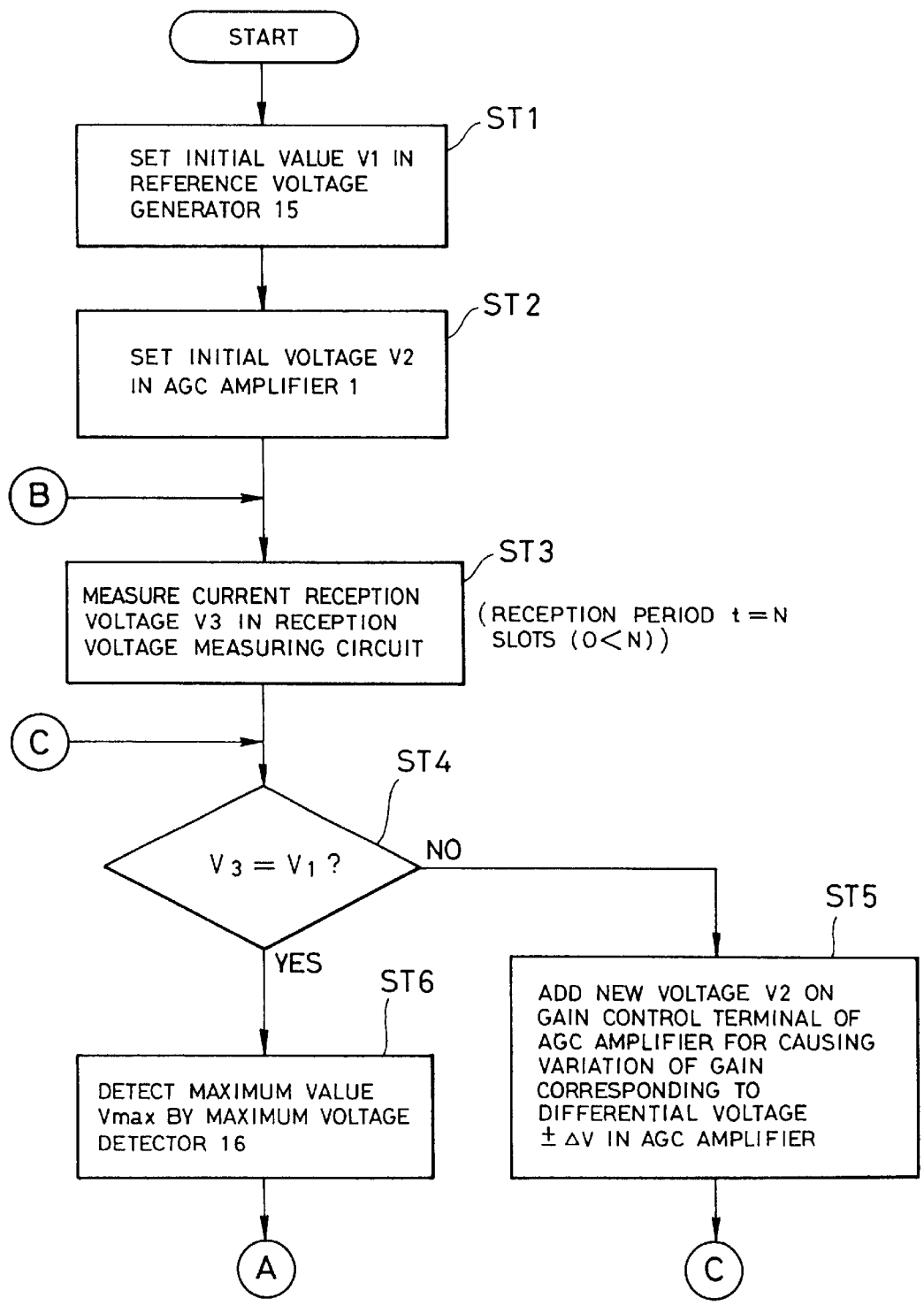
FIG. 8 is a flowchart showing operation of an overall AGC circuit.
Figure 9:
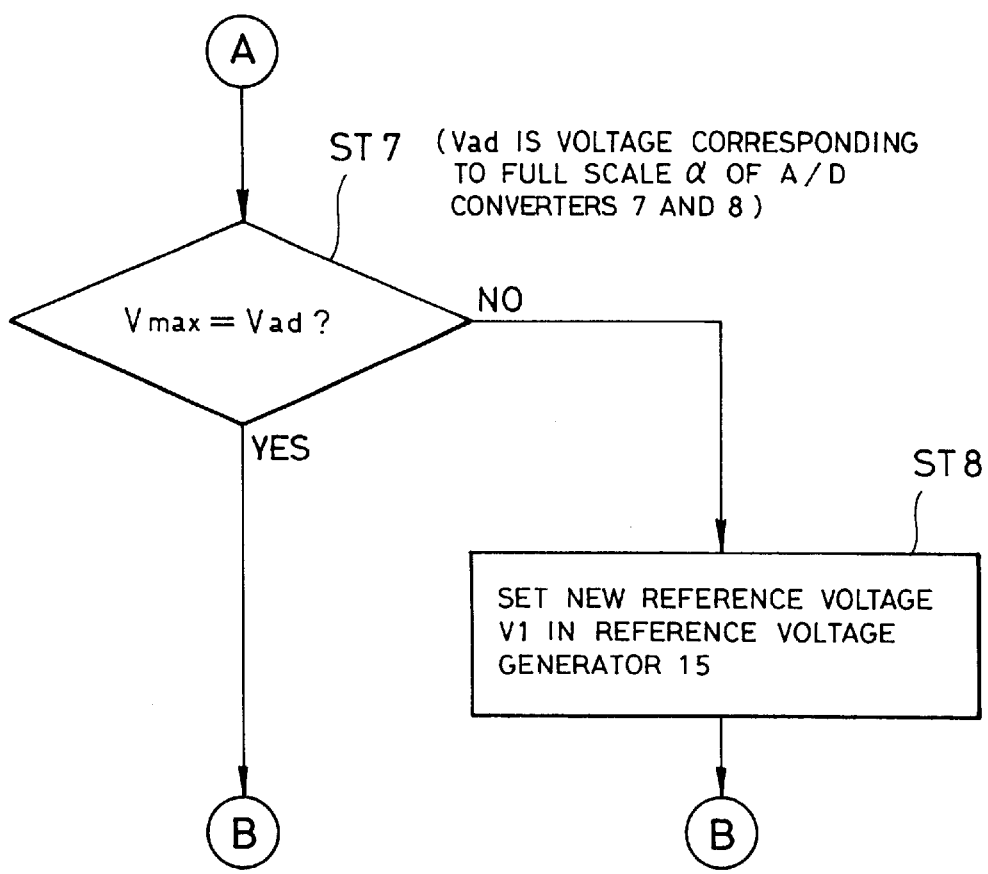
FIG. 9 is a flowchart showing operation of an overall AGC circuit.

Next, overall operation of the AGC circuit will be discussed. FIGS. 8 and 9 are flowcharts showing overall operation of the AGC circuit.

Referring to FIG. 8, at first, the initial value V1 of the reference voltage is set at the reference voltage generator 15 (ST1).

Next, an initial control voltage V2 is set to the AGC amplifier 1 (ST2).

Then, a current reception voltage (average value) V3 is measured by the reception voltage measuring circuit 12 (ST3).

Thereafter, the reference voltage V1 and the reception voltage (average value) V3 are compared by the comparator 11 (ST4). If the reference voltage V1 and the reception voltage (average value) V3 are not consistent, the comparator 11 applies a new voltage V2 to the gain control terminal 1a of the AGC amplifier 1 so as to cause variation of gain corresponding to differential voltage in the AGC amplifier 1 (ST5).

Next, returning to step ST4, steps ST4 and ST5 are repeated until the reference voltage V1 and the reception voltage (average value) V3 match with each other.

On the other hand, if the reference voltage V1 and the reception voltage (average value) V3 match with each other at ST4, the maximum value Vmax (V10) of the reception voltage is detected at the maximum voltage detector 16 (ST6). Next, the maximum voltage detector 16 checks whether the maximum value Vmax of the reception voltage matches with the voltage Vad corresponding to full scale of the A/D converters 7 and 8 or not (ST7 of FIG. 9). If matched with each other, the reference voltage V1 is held at the current value and the process from ST3 is executed again.

On the other hand, when the maximum value Vmax and the voltage Vad do not match with each other, the maximum voltage detector 16 sets new reference voltage V1 to the reference voltage generator 15 (ST8).

Then, the process from ST3 is executed again.

Here, discussion will be given as to how the maximum voltage detector 16 detects maximum value Vmax=voltage Vad (ST7).

For example, when the A/D converters 7 and 8 are 8 bit quantization and output coding in complement of 2, the lower 7 bits (0 to 127 in decimal number) become an absolute value of the measured amplitude.

At this time, when the maximum voltage detector 16 detects M times ("127 times") in N slots, the maximum voltage detector 16 makes judgment that input causing overflow in the A/D converters 7 and 8 is present.

Namely, assuming that B oversampling (B is positive integer) is caused in the A/D converters 7 and 8 in the system where A (A is positive integer) chips are present during one slot, A×N×B in number of sampling data are observed in N slots.

When M in number of data correspond "127" among A×N×B in number of data, the maximum voltage detector 16 modifies the reference voltage V1 in the reference voltage generator 15.

In this case, the reference voltage V1 is lowered. By this, the gain of the AGC amplifier 1 is also lowered.

Conversely, if all of A×N×B sampling data do not cause overflow and the maximum value Vmax among all data is less than Vad, the maximum voltage detector 16 modifies the reference voltage V1 of the reference voltage generator 15.

In this case, as new reference voltage V1, a voltage derived by multiplying the reference voltage by Vad/Vmax is set.

Accordingly, the voltage corresponding to "127" detected in N slots is more than or equal to one time and less than or equal to M times, the current reference value V1 is maintained (corresponding to the case where the answer at ST7 is YES). On the other hand when the voltage corresponding to "127" detected in N slots is zero times (not detected) or more than M times, the current reference value V1 is modified (corresponding to the case where answer at step ST7 is NO).

By employing the present invention not only in CDMA but also other modulation system, such as DMA or TDMA, distortion due to exceptional interference wave can be avoided. On the other hand, in the base station, the present invention is applicable.

Next, discussion will be given for the second embodiment of the present invention. The second embodiment provide a circuit for predicting number of stations (number of users) from level of the reception signal.

Namely, by convergence of the reference voltage V1 generated by the reference voltage generator 15 toward the average voltage V3 in N slots, number of users can be predicted from a ratio of Vmax/V1.

Namely, returning to flowcharts of FIGS. 8 and 9, when Vmax=Vad is not satisfied at step ST7, the new reference voltage v1 is set at ST8. Next, process is advanced to step ST3 and ST4, the reference voltage V1 converges to the average voltage V3 when V3=V1.

At this time, from a ratio between V1 and the maximum value Vmax obtained at ST7, number of users can be predicted.

However, the foregoing is the case when transmission powers provided to respective users from the base station are the same and slot times and so forth are synchronized.

According the present invention, since the AGC circuit including the amplifying means for amplifying the input signal and control means for controlling gain of the amplifying means depending upon the result of comparison, in which the amplitude of the input signal amplified by the amplifying means is compared with the first reference value, is constructed with incorporating the first reference value control means detecting the maximum value of the amplitude within a predetermined period of the input signal amplified by the amplifying means and controlling the first reference value depending upon the maximum value. Even upon demodulation of the signal of the modulation type, in which the frequency axis are used in common by a plurality of receivers, such as CDMA, occurrence of distortion of the input signal of the A/D converter can be prevented to enable use of full scale of the A/D converter.

According to another invention, the control method of the AGC circuit including a first process of amplifying of the input signal, comparing of the amplitude of the input signal with the first reference value and controlling amplification of the input signal depending upon result of comparison, includes a second process of detecting the maximum value of the amplitude of the amplified input signal in the predetermined period and controlling the first reference value depending upon the maximum value. Even upon demodulation of the signal of the modulation type, in which the frequency axis are used in common by a plurality of receivers, such as CDMA, occurrence of distortion of the input signal of the A/D converter can be prevented to enable use of full scale of the A/D converter.

What is claimed is:

1. An AGC circuit comprising:
   an amplifier configured to amplify an input signal;
   a controller configured to compare an amplitude of the input signal and a first reference value and to control a gain of said amplifier depending upon a result of the comparison;
   a first reference value controller configured to detect a maximum value of the amplitude of the input signal amplified by said amplifier and to control the first reference value depending upon the maximum value; and
   an A/D converter configured to convert the input signal into digital data at a predetermined sampling rate and to output the digital data to said controller and to said first reference value controller, the second reference value being a voltage corresponding to a full scale of said A/D converter,
   wherein said first reference value controller makes a judgment that the maximum value exceeds the second reference value, when data equal to the second reference value is obtained exceeding a reference number of times among data from said A/D converters obtained through a predetermined times of sampling.

2. An AGC circuit comprising:
   amplifying means for amplifying an input signal;
   control means comparing an amplitude of said input signal and a first reference value and controlling a gain of said amplifying means depending upon a result of the comparison;
   first reference value control means for detecting a maximum value of the amplitude of said input signal amplified by said amplifying means and controlling said first reference value depending upon said maximum value; and
   A/D converting means for performing conversion of said input signal into a digital data at a predetermined sampling rate and outputting the digital data to said control means and said first reference value control means, said second reference value being a voltage corresponding to a full scale of said A/D converting means,
   wherein said first reference value control means makes a judgment that said maximum value is less than said second reference value when no data equal to said second reference value is obtained among data from said A/D converting means obtained through a predetermined times of sampling.

3. An AGC circuit comprising:
   amplifying means for amplifying an input signal;
   control means comparing an amplitude of said input signal and a first reference value and controlling a gain of said amplifying means depending upon a result of the comparison;
   first reference value control means for detecting a maximum value of the amplitude of said input signal amplified by said amplifying means and controlling said first reference value depending upon said maximum value; and
   A/D converting means for performing conversion of said input signal into a digital data at a predetermined sampling rate and outputting the digital data to said control means and said first reference value control means, said second reference value being a voltage corresponding to a full scale of said A/D converting means,
   wherein said first reference value control means makes a judgment that said maximum value is equal to said second reference value when data equal to said second reference value is obtained for one time or less than or equal to a reference number of times among data from said A/D converting means obtained through a predetermined times of sampling.

4. The AGC circuit as set forth in claim 1, wherein the input signal is a quadrature modulation signal, said AGC circuit further comprising a quadrature demodulator configured to perform quadrature demodulation of the input signal, said A/D converter being constructed with first and second A/D converters performing A/D conversion for respectively an in-phase demodulated component and a quadrature demodulated component from said quadrature demodulator, and an average value derived by composing sampling data from the first and second A/D converters is input to said controller.

5. The AGC circuit as set forth in claim 1, wherein the input signal is a multiplexed signal according to a CDMA system.

6. An AGC circuit comprising:
   amplifying means for amplifying an input signal;
   control means comparing an amplitude of said input signal and a first reference value and controlling a gain of said amplifying means depending upon a result of the comparison; and
   first reference value control means for detecting a maximum value of the amplitude of said input signal amplified by said amplifying means and controlling said first reference value depending upon said maximum value,
   wherein said input signal is a multiplexed signal according to a CDMA system,
   wherein said control means and said first reference value control means include a function predicting a number of stations transmitting said input signal on the basis of said first and second reference values.

7. The AGC circuit as set forth in claim 1, wherein the input signal is a multiplexed signal according to an FDMA system.

8. The AGC circuit as set forth in claim 1, wherein the input signal is a multiplexed signal according to a TDMA system.

9. A control method of an AGC circuit comprising:
   a first process of amplifying an input signal, including comparing an amplitude of the amplified input signal with a first reference value and controlling the amplitude of said input signal depending upon the result of the comparison;

a second process of detecting a maximum value of an amplitude of said amplified input signal within a predetermined period and controlling said first reference value depending upon said maximum value; and A/D converter converting said input signal into a digital data at a predetermined sampling rate and taking said digital data as said input signal to be used in said first and second processes, wherein said second reference value is a voltage value corresponding to a full scale of said A/D converter, wherein said second process makes a judgment that said maximum value exceeds said second reference value when data equal to said second reference value is obtained exceeding a reference number of times among data from said A/D converter obtained through a predetermined times of sampling.

10. A control method of an AGC circuit comprising:

a first process of amplifying an input signal, including comparing an amplitude of the amplified input signal with a first reference value and controlling the amplitude of said input signal depending upon the result of the comparison;

a second process of detecting a maximum value of an amplitude of said amplified input signal within a predetermined period and controlling said first reference value depending upon said maximum value; and A/D converter performing conversion of said input signal into a digital data at a predetermined sampling rate and taking said digital data as said input signal to be used in said first and second processes, wherein said second reference value is a voltage value corresponding to a full scale of said A/D converter, wherein said second process makes a judgment that said maximum value is less than said second reference value when no data equal to said second reference value is obtained among data from said A/D converter obtained through a predetermined times of sampling.

11. A control method of an AGC circuit comprising:

a first process of amplifying an input signal, including comparing an amplitude of the amplified input signal with a first reference value and controlling the amplitude of said input signal depending upon the result of the comparison;

a second process of detecting a maximum value of an amplitude of said amplified input signal within a predetermined period and controlling said first reference value depending upon said maximum value; and A/D converter performing conversion of said input signal into a digital data at a predetermined sampling rate and taking said digital data as said input signal to be used in said first and second processes, wherein said second reference value is a voltage value corresponding to a full scale of said A/D converter, wherein second process makes a judgment that said maximum value is equal to said second reference value when data equal to said second reference value is obtained for one time or less than or equal to a reference number of times among data from said A/D converter obtained through a predetermined times of sampling.

12. The control method of an AGC circuit as set forth in claim 9, wherein said input signal is a quadrature modulation signal, said method further comprises fourth process of performing quadrature demodulation of said input signal, said A/D converter is constructed with first and second A/D converters performing A/D conversion for respectively an in-phase demodulated component and a quadrature demodulated component from said quadrature demodulator, and an average value derived by composing sampling data from said first and second A/D converters is input to said first process.

13. The control method of an AGC circuit as set forth in claim 9, wherein said input signal is a multiplexed signal according to a CDMA system.

14. A control method of an AGC circuit comprising:

a first process of amplifying an input signal, including comparing an amplitude of the amplified input signal with a first reference value and controlling the amplitude of said input signal depending upon the result of the comparison; and a second process of detecting a maximum value of an amplitude of said amplified input signal within a predetermined period and controlling said first reference value depending upon said maximum value, wherein said input signal is a multiplexed signal according to a CDMA system, wherein said first and second processes include a third process of predicting a number of stations transmitting said input signal on the basis of said first and second reference values.

15. The control method of an AGC circuit as set forth in claim 9, wherein said input signal is a multiplexed signal according to an FDMA system.

16. The control method of an AGC circuit as set forth in claim 9, wherein said input signal is a multiplexed signal according to a TDMA system.

* * * * *